United States Patent
Lin

(10) Patent No.: US 7,468,890 B2
(45) Date of Patent: Dec. 23, 2008

(54) GRAPHICS CARD HEAT-DISSIPATING DEVICE

(75) Inventor: Wei-Pin Lin, Chung-Ho (TW)

(73) Assignee: Cooler Master Co., Ltd., Taipei Hsien (TW)

( * ) Notice: Subject to any disclaimer, the term of this patent is extended or adjusted under 35 U.S.C. 154(b) by 0 days.

(21) Appl. No.: 11/808,579

(22) Filed: Jun. 12, 2007

(65) Prior Publication Data

US 2008/0043446 A1  Feb. 21, 2008

(30) Foreign Application Priority Data

Jul. 4, 2006  (TW)  ............................... 95211758 U

(51) Int. Cl.
*H05K 7/20* (2006.01)
*F28F 7/00* (2006.01)
*H01L 23/34* (2006.01)

(52) U.S. Cl. ...................... 361/720; 166/80.2; 166/185; 257/718; 257/719; 361/690; 361/703; 361/707

(58) Field of Classification Search ................. 361/697, 361/704, 709–710, 719; 165/80.3, 104.33, 165/185; 174/16.1, 16.3
See application file for complete search history.

(56) References Cited

U.S. PATENT DOCUMENTS

| | | | |
|---|---|---|---|
| 3,766,439 A * | 10/1973 | Isaacson | 361/714 |
| 5,815,371 A * | 9/1998 | Jeffries et al. | 361/704 |
| 6,424,532 B2 * | 7/2002 | Kawamura | 361/708 |
| 6,882,536 B2 * | 4/2005 | Deeney et al. | 361/719 |
| 7,019,974 B2 * | 3/2006 | Lee et al. | 361/700 |
| 7,064,957 B1 * | 6/2006 | Liang et al. | 361/719 |
| 7,209,356 B2 * | 4/2007 | Lee et al. | 361/719 |
| 7,319,588 B2 * | 1/2008 | Peng et al. | 361/700 |
| 7,327,576 B2 * | 2/2008 | Lee et al. | 361/719 |
| 2005/0259401 A1 * | 11/2005 | Han et al. | 361/704 |
| 2007/0230125 A1 * | 10/2007 | Lo et al. | 361/697 |

\* cited by examiner

*Primary Examiner*—Gregory D Thompson
(74) *Attorney, Agent, or Firm*—Rosenberg, Klein & Lee

(57) ABSTRACT

A graphics card heat-dissipating device includes: a main body, a support seat, and a fixed element. The main body has a first heat-dissipating portion and a second heat-dissipating portion, and the first heat-dissipating portion has a first opening and the second heat-dissipating portion has a second opening. The support seat is used for supporting a chip, and the support seat has a third opening. The fixed element is fixed on the first heat-dissipating portion by passing through the second opening, the third opening and the first opening in sequence for attaching the chip on the first heat-dissipating portion. Therefore, the heat convection function and the heat-dissipating efficiency are increased.

9 Claims, 3 Drawing Sheets

GRAPHICS CARD HEAT-DISSIPATING DEVICE

BACKGROUND OF THE INVENTION

1. Field of the Invention

The present invention relates to a heat-dissipating device, and particularly relates to a graphics card heat-dissipating device.

2. Description of the Related Art

General electric machinery equipment or electronic equipment has many electronic components. When the electric machinery equipment or electronic equipment is on work, the electronic components would generate heat and electromagnetic radiation.

The heat generates from the electronic components would increase temperature of electronic components and effect efficiency of the electric machinery equipment or electronic equipment. Hence, the electric machinery equipment or electronic equipment would crash easily due to high temperature of electronic components.

In general, heat-dissipating principle of heat sink includes (1) active; (2) passive. With regard to active heat-dissipating principle, an extra fan is disposed close to the electronic components to guide cooling air to the heat sink for dissipating heat that is transmitted from the electronic components to the heat sink. With regard to passive heat-dissipating principle, the heat transmitted from the electronic components to the heat sink is dissipated by nature convection.

Referring to FIG. 1, a known heat sink includes a base seat 100, a fixed seat 101, and a chip 102. The base seat 100 is made of metal material such as copper. The chip 102 is disposed on the fixed seat 101, and the fixed seat 101 is a PCB (Printed Circuit Board). The chip 102 is disposed on the base seat 100. When the chip 102 becomes overheated, the heat of the chip 102 is dissipated by the base seat 100.

However, when heat convection is raised, the heat convection is stopped by the fixed seat 101. Hence, the efficiency of heat convection is decreased. Therefore, the heat of the chip 102 is not easy to be dissipated and the chip 102 is overheated.

SUMMARY OF THE INVENTION

The present invention provides a graphics card heat-dissipating device. The present invention provides a main body that has a first heat-dissipating portion and a second heat-dissipating portion. The first heat-dissipating portion contacts with a graphics card (the first heat-dissipating portion directly contacts process chips and the other electronic components of the graphics card) for dissipating heat, and the second heat-dissipating portion is separated from the first heat-dissipating portion and is suspended in midair for solving bad heat convection of prior art.

Moreover, the first heat-dissipating portion has a plurality of fins formed on an outside thereof, and the second heat-dissipating portion has a plurality of fins formed on an outside thereof for increasing heat-dissipating function.

In addition, the graphics card heat-dissipating device further includes a fixed element. The fixed element is used to fix the chip and make the chip attach on the first heat-dissipating portion easily.

One aspect of the present invention is a graphics card heat-dissipating device, including: a main body, a support seat, and a fixed element. The main body has a first heat-dissipating portion and a second heat-dissipating portion, and the first heat-dissipating portion has a first opening and the second heat-dissipating portion has a second opening. The support seat is used for supporting a chip, and the support seat has a third opening. The fixed element is fixed on the first heat-dissipating portion by passing through the second opening, the third opening and the first opening in sequence for attaching the chip on the first heat-dissipating portion.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which.

DETAILED DESCRIPTION OF PREFERRED BEST MOLDS

Figure 1:
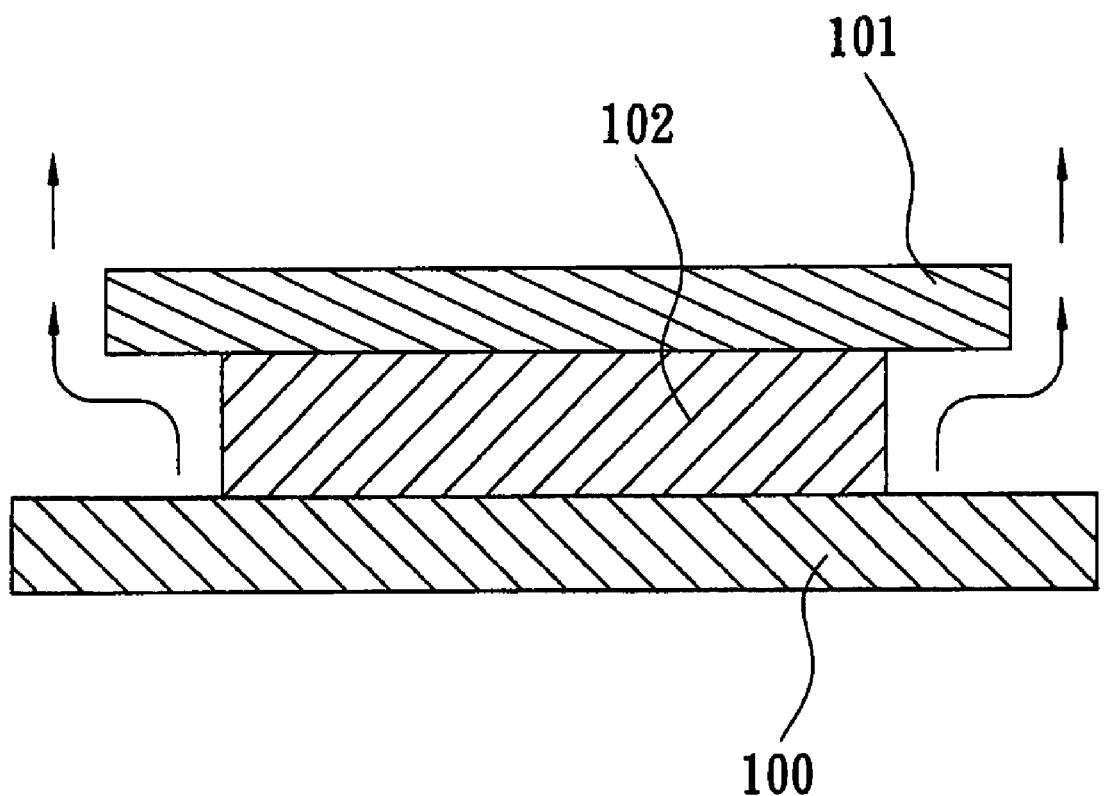
FIG. 1 is a cross-sectional view of a heat sink of the prior art.
Figure 2:
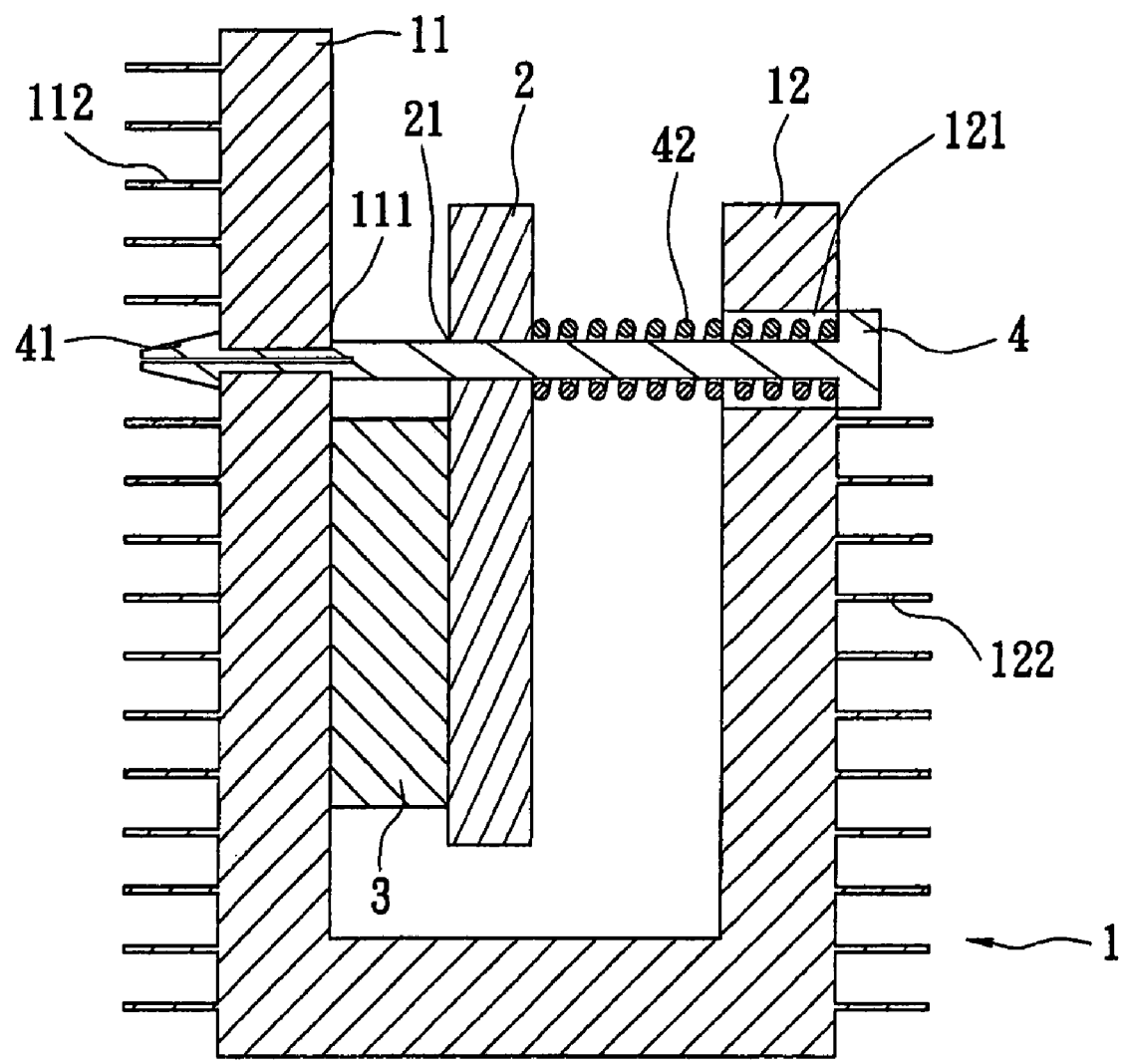
FIG. 2 is a cross-sectional view of a graphics card heat-dissipating device according to one embodiment of the present invention.

Referring to FIG. 2, one embodiment of the present invention provides a graphics card heat-dissipating device, comprising a main body 1, a support seat 2, and a fixed element 4. The main body 1 is an U-shaped, is made of metal material, and is a one-piece main body. Moreover, the main body 1 has a first heat-dissipating portion 11 and a second heat-dissipating portion 12. The first heat-dissipating portion 11 has a first opening 111, and the first heat-dissipating portion 11 has a plurality of fins 112 formed on an outside thereof. The second heat-dissipating portion 12 has a second opening 121, and the second heat-dissipating portion 12 has a plurality of fins 122 formed on an outside thereof. The second opening 121 is larger than the first opening 111.

The support seat 2 can be a PCB (Printed Circuit Board). The support seat 2 is used to support a chip 3, and the support seat 2 has a third opening 21. The fixed element 4 has a fixed portion 41 formed on a front side thereof and fixed on the first heat-dissipating portion 11, and the fixed element 4 has a spring 42 disposed on a back side thereof. The spring 42 is passed through the second opening 121. The fixed element 4 can be a spring screw. The fixed element 4 is fixed on the first heat-dissipating portion 11 by passing through the second opening 121, the third opening 21 and the first opening 111 in sequence for attaching the chip 3 on the first heat-dissipating portion 11. Hence, the fixed element 4 would make the chip 3 contact the main body 1 easily.

Figure 3:
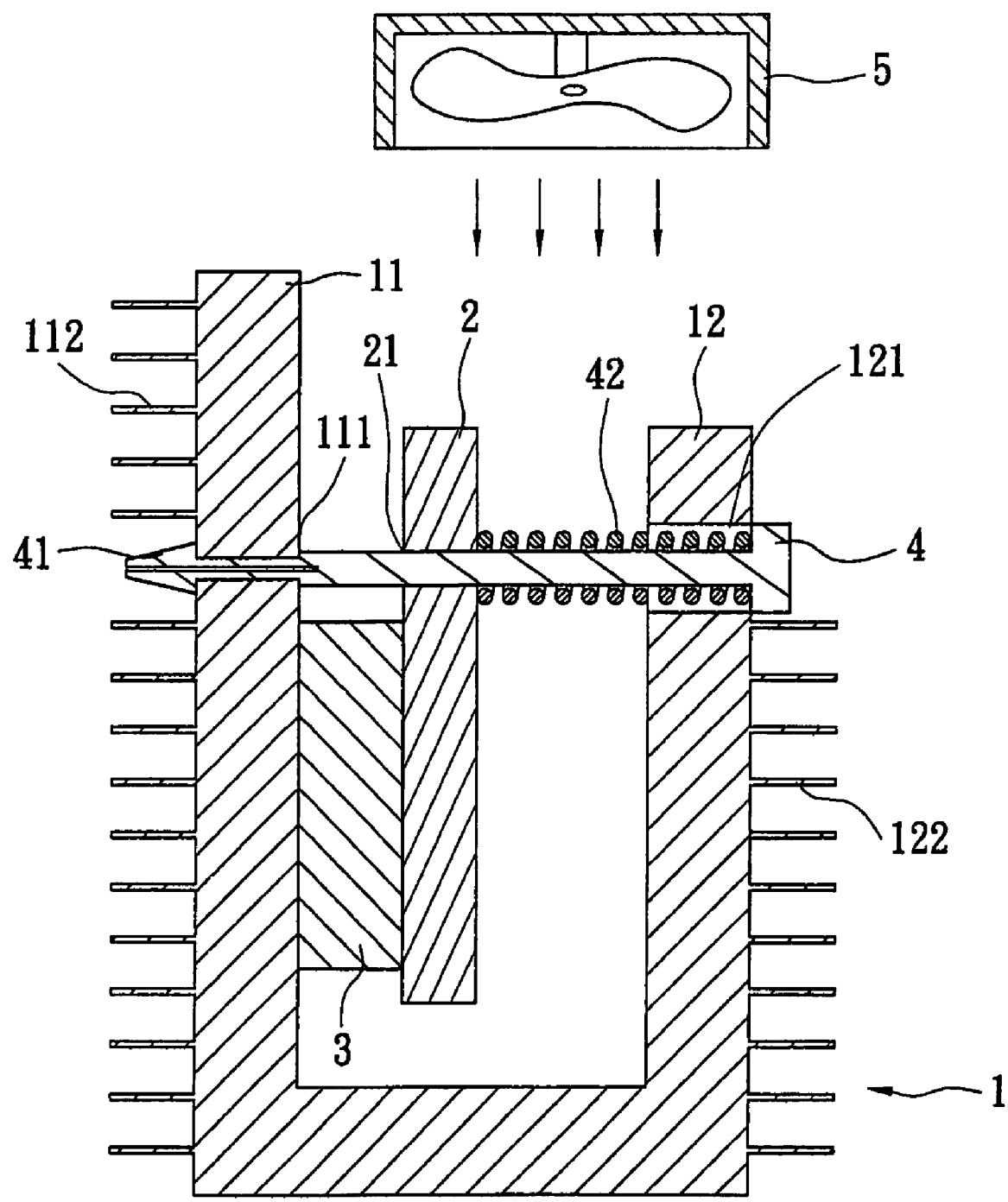
FIG. 3 is a cross-sectional view of a graphics card heat-dissipating device according to another embodiment of the present invention.

Referring to FIG. 3, another embodiment of the present invention further comprises a wind-guiding cover 5 close to the main body 1. The wind-guiding cover 5 would guide wind into the main body 1 for accelerating heat-dissipating function.

The purpose of the present invention is providing a main body 1 that has a first heat-dissipating portion 11 and a second heat-dissipating portion 12. The first heat-dissipating portion 11 contacts with a graphics card (the first heat-dissipating portion directly contacts processing chips and the other electronic components of the graphics card) for dissipating heat, and the second heat-dissipating portion 12 is separated from the first heat-dissipating portion 1 and is suspended in midair for solving bad heat convection of prior art.

Moreover, the first heat-dissipating portion 11 has a plurality of fins 112 formed on an outside thereof, and the second heat-dissipating portion 12 has a plurality of fins 122 formed on an outside thereof for increasing heat-dissipating function. In addition, the graphics card heat-dissipating device further includes a fixed element 4. The fixed element 4 is used to fix the chip 3 and makes the chip 3 attach on the first heat-dissipating portion 11 easily.

In conclusion, the graphics card heat-dissipating device of the present invention has some advantages, as follows:

(1) Both the first heat-dissipating portion 11 and the second heat-dissipating portion 12 are used to increase heat convection function and heat-dissipating efficiency.

(2) The fins 112 of the first heat-dissipating portion 11 and the fins 122 of the second heat-dissipating portion 12 are used to increase heat-dissipating function.

(3) The fixed element 4 is used to fix the chip 3 and make the chip 3 attach on the first heat-dissipating portion 11 easily.

(4) The wind-guiding cover 5 is close to the main body 1 for accelerating heat-dissipating function.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A graphics card heat-dissipating device, comprising:
   a U-shaped main body having;
      a first heat-dissipating portion;
      a second heat-dissipating portion;
      wherein the first heat-dissipating portion has a first opening and the second heat-dissipating portion has a second opening, the first heat-dissipating portion having a plurality of fins formed on an outside surface thereof, and the second heat-dissipating portion having a plurality of fins formed on an outside surface thereof;
   a planar portion being formed on an outside surface between the first heat-dissipating portion and the second heat-dissipating portion for mounting said main body on a planar surface;
   a support seat for supporting a chip, the support seat having a third opening; and
   a fixed spring biased element being fixed on the first heat-dissipating portion by passing said fixed element through the second opening, the third opening and the first opening for securing the chip against an inner surface of the first heat-dissipating portion.

2. The graphics card heat-dissipating device as claimed in claim 1, wherein the main body is made of metal material.

3. The graphics card heat-dissipating device as claimed in claim 1, wherein the main body is a one-piece main body.

4. The graphics card heat-dissipating device as claimed in claim 1, wherein the second opening is larger than the first opening.

5. The graphics card heat-dissipating device as claimed in claim 1, wherein the support seat is a PCB (Printed Circuit Board).

6. The graphics card heat-dissipating device as claimed in claim 1, wherein the fixed element has a fixed portion formed on a front side thereof and fixed on the first heat-dissipating portion, and the fixed element has a spring disposed on a back side thereof.

7. The graphics card heat-dissipating device as claimed in claim 1, wherein the fixed element is a spring screw.

8. The graphics card heat-dissipating device as claimed in claim 1, further comprising a wind-guiding cover close to the main body for accelerating heat-dissipating function.

9. The graphics card heat-dissipating device as claimed in claim 1, wherein the second heat-dissipating portion is separated from said first heat-dissipating portion by an air gap, and said second heat-dissipating portion being formed for providing an additional path for thermal conduction and a path for thermal convection to the air gap.

* * * * *